United States Patent [19]

Simmons et al.

[11] Patent Number: 4,806,997
[45] Date of Patent: Feb. 21, 1989

[54] DOUBLE HETEROSTRUCTURE OPTOELECTRONIC SWITCH

[75] Inventors: John G. Simmons, St. Annes-On-Sea, England; Geoffrey W. Taylor, Berkeley Heights, N.J.

[73] Assignee: AT&T Laboratories American Telephone and Telegraph Company, Murry Hill, N.J.

[21] Appl. No.: 147,052

[22] Filed: Jan. 22, 1988

Related U.S. Application Data

[63] Continuation of Ser. No. 745,398, Jun. 14, 1985, abandoned.

[51] Int. Cl.$^4$ .................................. H01L 29/161
[52] U.S. Cl. .................................. 357/16; 357/34; 357/17; 357/56; 357/22
[58] Field of Search .................. 357/13, 16, 17, 55, 357/34, 34 HB, 30 E (U.S. only), 30 B (U.S. only), 30 D (U.S. only), 30 P (U.S. only), 30 I, 56, 22 A

[56] References Cited

U.S. PATENT DOCUMENTS 4,184,170  1/1980  Burnham et al. ............... 357/16 X
4,220,960  9/1980  Liu et al. .......................... 357/16 X

FOREIGN PATENT DOCUMENTS 0084393  7/1983  European Pat. Off. ...... 357/22 MD

OTHER PUBLICATIONS

Solomon, "A Comparison of Semiconductor Devices for High-Speed Logic," *Proceedings of the IEEE*, vol. 70, No. 5, May 1982, pp. 489–509.

Matsushita et al, "A SIPOS-Si Heterojunction Transistor," *Jap. Jour. of Appl. Physics*, vol. 20 (1981), Supp. 20-1, Proc's of the 12th Conf. on Solid State Devices, pp. 75–81.

Fonstad, "Consideration of the Relative Frequency Performance Potential of Inverted Heterojunction n-p-n Transistors," *IEEE Electron Device Letters*, vol. EDL-5, No. 3, Mar. 84, 99≧14 100.

Moravvej-Farshi et al, "Operational Silicon Bipolar Inversion-Channel Field-Effect Transistor (BICFET)," *IEEE Electron Device Letters*, vol. EDL-7, No. 9, Sep. 86, pp. 513–515.

*Primary Examiner*—Andrew J. James
*Assistant Examiner*—William A. Mintel
*Attorney, Agent, or Firm*—Richard D. Laumann; Gregory C. Ranieri

[57] ABSTRACT

A double heterostructure opto-electronic device capable of both electronic and photonic switching is described.

10 Claims, 4 Drawing Sheets

DOUBLE HETEROSTRUCTURE OPTOELECTRONIC SWITCH

This application is a continuation of application Ser. No. 1745,398, filed June 14, 1985, now abandoned.

TECHNICAL FIELD

This invention relates generally to the field of semiconductor devices and particularly to such devices which are capable of switching both optical and electrical signals and are useful in optical logic circuits.

BACKGROUND OF THE INVENTION

Switches are an important class of semiconductor devices. Many types of such devices have been devised which are capable of switching either electronic or optical signals. A single device capable of simultaneously switching both optical and electrical signals and useful in optical logic circuit would be desirable.

Switching of optical signals is desirable in optical communications and integrated opto-electronic circuits. Devices capable of, for example, steering and modulating optical signals have been developed. For example, lithium niobate waveguides and the quantum well self electro-optic effect device (SEED) have been developed. However, the optical gain of these devices is less than unity and the input control signal is electrical.

A recently developed solid state device, termed a BICFET, (which is an acronym for Bipolar Inversion Channel Field Effect Transistor) has recently been developed, and is described in copending application Ser. No. 653,440, now abandoned, assigned to a common assignee and incorporated herein by reference. In one embodiment, this device comprises a metallic emitter contacting a wider bandgap region; a narrow bandgap collector region; and a channel contact. The latter is to an inversion layer which is formed at the interface between the wider bandgap region and the narower bandgap region. Further embodiments enable the BICFET to function as either a photodetector or a light emitter. However, simultaneous switching of both types of signals was not described.

SUMMARY OF THE INVENTION

We have found that a device comprising an open source BICFET and a p-n heterojunction contacting said BICFET is capable of switching both optical and electrical signals. The device comprises emitter, source and collector regions with a wide bandgap region contacting the collector region. There are electrical contacts to at least the emitter and the wide bandgap region. The device is characterized by distinct electrical and optical states. In the first state, the device has a high electrical impedance and emits no light. In the second state, the device has a low impedance and strong optical emission occurs. Switching between two states may be obtained by either optical or electrical inputs. Optical logic functions may be performed.

For reasons of clarity, the elements of the devices are not drawn to scale.

DETAILED DESCRIPTION

Figure 1:
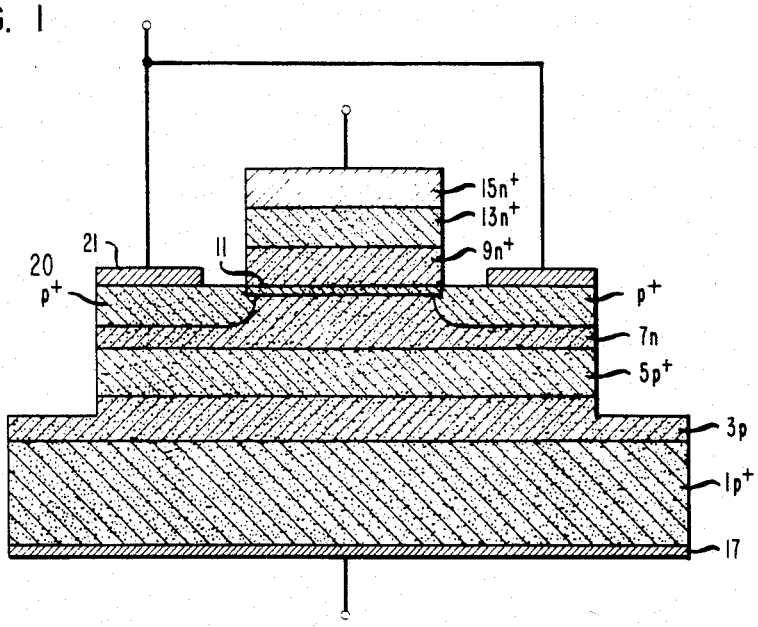
FIG. 1 represents a switch according to this invention.

One embodiment of a device according to our invention is depicted in FIG. 1. The device comprises a substrate 1, buffer layer 3, wide bandgap layer 5, narrow bandgap layer 7, and a wide bandgap layer 9. Layer 7 is termed the collector. Layer 9 is fairly highly doped and is termed the semi-insulator. Near the interface between the semiconductor and the semi-insulator, there desirably is a highly doped extremely thin layer. The highly doped layer, which is termed a charge sheet, may be in either layer 7 or 9, but in practice, it is often easier to place it in layer 7 to obtain the highest doping levels. A typical thickness is between 20 and 60 Angstroms. The top layer 13 is a heavily doped cap structure. The latter facilitates the formation of ohmic contacts. The highly doped cap layer 13, as well as a metallic layer 15, comprises the emitter contact. There is also an electrical contact 17 to the substrate and a contact 21 to the source 11 via a highly doped layer 20. In a preferred embodiment, the device is operated as an open source device, i.e., no voltage is applied to the source. Layers 3 and 5 have a first conductivity type and layers 7, 9 and 13 have a second conductivity type. The charge sheet also has the first conductivity type.

In a particular embodiment, the substrate 1 was highly doped p+ type GaAs, the buffer layer 3 was GaAs having a thickness of 0.3 $\mu$m and the wide bandgap layer 5 was a 0.5 $\mu$m thick layer of AlGaAs which was heavily doped p+. The narrow bandgap layer 7 comprised n-type GaAs and was 1.0 $\mu$m thick. The charge sheet 11 was 30 Angstroms thick and had an acceptor, (i.e., p type) doping level of approximately $10^{17} cm^{-3}$. The semi-insulator was 400 Angstrom thick n-type AlGaAs. The cap layer 13 comprised heavily doped n+ GaAs having a thickness of 5,000 Angstroms.

The epitaxial layers of the structure are expediently grown by molecular beam epitaxy. This growth technique is well-known to those skilled in the art and need not be described in detail. It appears to be a preferred growth technique because of the control it affords over layer thicknesses and compositions. Other growth techniques are, however, contemplated.

After growth, the structure was masked and etched down to the p+ epitaxial buffer layer, thus forming a mesa structure. A further etching was performed to layer 7: A p+ diffusion was now made into layer 7. Contacts to the cap layer, i.e., emitter, and source, if desired, were made using well-known and conventional lift-off techniques with Au/Sn. The collector metallization contacts at least part of the diffused region. If desired, there may be an open emitter area to allow for transmission of light through the cap layer. Conventional and well known lithographic techniques are used for the etching, diffusion and metallization steps. The contacts were alloyed in forming gas at 450 degrees C.

for approximately 20 seconds. A typical mesa diameter is 200 μm and the circular opening is typically 130 μm.

It will be readily appreciated that other materials may be used. For example, other Group III-V compound semiconductors may be used as well as Group II-VI compound semiconductors. Furthermore, the dimensions given are exemplary only and for many purposes may be varied for optimization of device characteristics with respect to the particular application contemplated.

It is believed that the device operation, and several applications, will be better understood if several operating characteristics are briefly summarized. The light versus current characteristics of the device were measured and it was found that almost no light was emitted for device currents less than approximately 3 ma. The emitter and wide bandgap regions were electrically contacted. However, when this current value was exceeded, the light output increased at first superlinearly, then linearly, and finally saturated such as the light output does in a conventional light emitting diode. It is thus evident that essentially no light is produced in the electrical OFF state of the device and that the device functions as a light emitting diode in the ON state. The device is therefore characterized by two distinct optical states and may be switched electrically between the two.

However, the electrical switching characteristics of the device are strongly influenced by the intensity of any incident light. Total control over the switching voltage may be obtained with only a modest input optical intensity. This permits optical switching to be performed.

Figure 2:
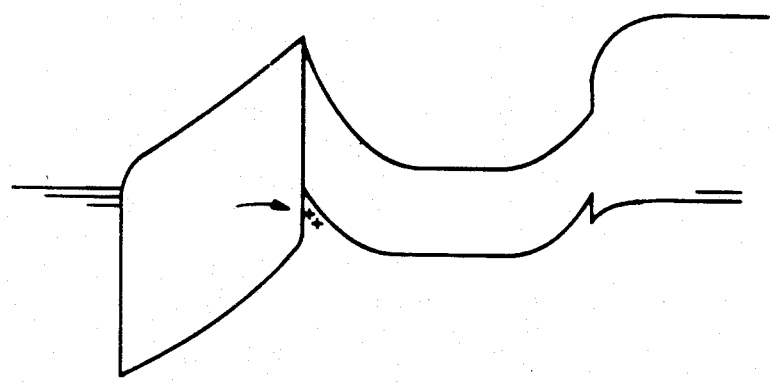
FIGS. 2-4 are energy band diagrams useful in explaining the operation of the embodiment depicted in FIG. 1.
Figure 3:
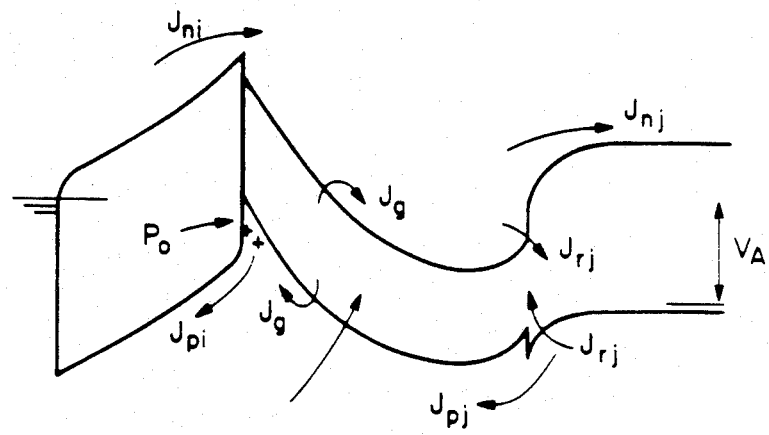
Figure 4:
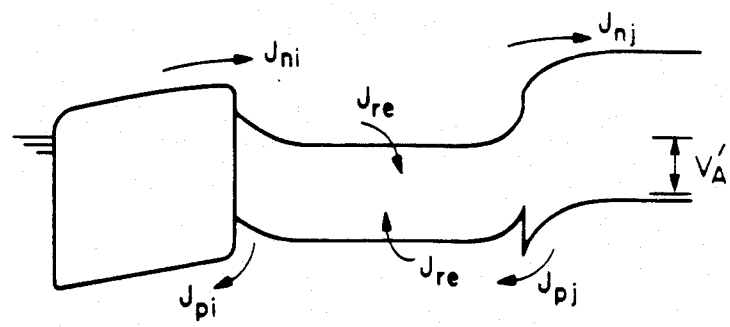

The device operation and switching may be better understood by reference to the energy band diagrams depicted in FIGS. 2-4. For reasons of clarity, only the semi-insulator, collector and wide bandgap layers, i.e., regions 9, 7 and 5, respectively, are depicted. The source 11, not shown, bends the collector region energy levels up at the interface, thus permitting formation of an inversion layer. FIGS. 2-4 show the zero bias case, a forward bias applied prior to switching and a forward bias applied after switching, respectively.

In the high impedance state before switching, the semi-insulator and the collector wide bandgap layer junction are slightly forward biased, but the collector depletion region is reverse biased and the voltage is dropped almost entirely in that region.

The various current components flowing are indicated as in FIG. 3. $J_{ni}$ and $J_{pi}$ are the electron and hole currents flowing in the semi-insulator; $J_g$ is the generation current and the current in the collector depletion region; $J_{rj}$ is the recombination current in the wide bandgap layer junction and $J_{nj}$ and $J_{pj}$ are the electron and hold diffusion currents, respectively, across the collector wide bandgap layer junction. Little voltage is dropped across the collector-wide bandgap layer and $J_{pj}$ and $J_g$ are small as is the hole current. $J_{ni}$ is small and the device is in a high impedance state. As the voltage is increased, $J_{pi}$ increases as does the hole concentration, $P_0$, at the semi-insulator collector interface.

The increase in $P_0$ occurs as a result of the production of electron hole pairs in the collector depletion region which may occuur by, for example, light absorption as well as thermal generation. The increase leads to an increase in $J_{ni}$, and therefore in $J_{nj}$ and $J_{pj}$. When $J_{pj}$ is greater than $J_g$, there is a loop gain in excess of unity and the phases of the signals are such that the feedback is positive and the condition for instability exists. Regenerative switching occurs and the device enters the regime of negative resistance in which the voltage collapses and the current increases. When the voltage across the collector depletion region collapses to its minimum value, determined by the condition of strong inversion at the interface, the device leaves the region of negative resistance and the energy band diagram depicted in FIG. 4 results. The surface hole density has risen to a maximum value and both the semi-insulator and the collector wide bandgap junction are strongly forward biased.

The stable state is reached when the current gain internal to the device falls below unity. In the ON state, the recombination current effectively diverts the hole current flowing to the semi-insulator and the electron current flowing to the wide bandgap junction and consequently, the loop current gain of the system is reduced.

The substantial recombination occurring gives rise to strong electroluminescence as one would expect for a double heterostructure. With formation of a suitable optical cavity, lasing action is obtained. Methods, for example, cleaving, for forming the cavity are well known and need not be described in detail.

Figure 5:
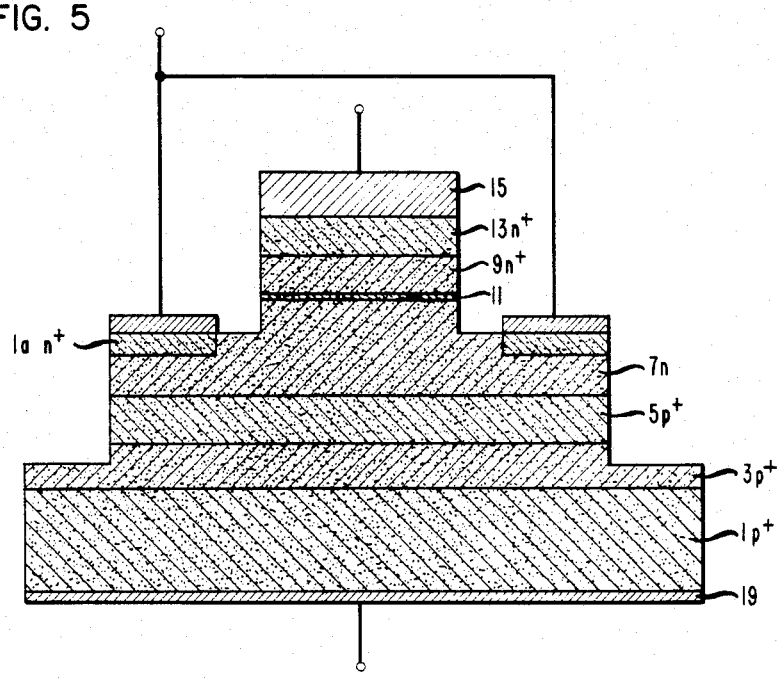
FIG. 5 is a schematic representation of another embodiment of this invention.

It will be readily appreciated that other embodiments are contemplated. For example, in FIG. 5, an embodiment is depicted in which the collector is contacted through contact 21. Numerals identical to those in FIG. 1 represent identical elements. In this case, an n+ diffusion 1a is made. Still other embodiments will be thought of by those skilled in the art. For example, as mentioned, only the emitter and wide bandgap substrate region may be contacted if two terminal operation is desired.

Both devices depicted may have light enter through the emitter contact and be emitted through the emitter contact. However, it will be readily appreciated that the light may be incident parallel to the collector layer, i.e., directly into the cavity. This is a preferred embodiment for lasing action as the optical cavity, as well as optical confinement, are more easily obtained. Of course, light will be emitted parallel to the longitudinal axis of the cavity.

Figure 6:
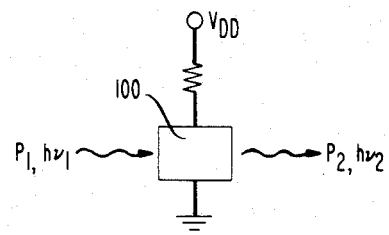
FIG. 6 shows exemplary current-voltage characteristic curves for a device according to this invention.

One device application is indicated schematically in FIG. 6. In addition to the double heterostructure optoelectronic switch just described and indicated generally as 100, thre is a resistance R, placed in series between switch 100 and voltage source, $V_{DD}$. The other switch connection is made to ground. Thus, the emitter and wide bandgap regions are connected to a ground and voltage source, respectively.

Figure 7:
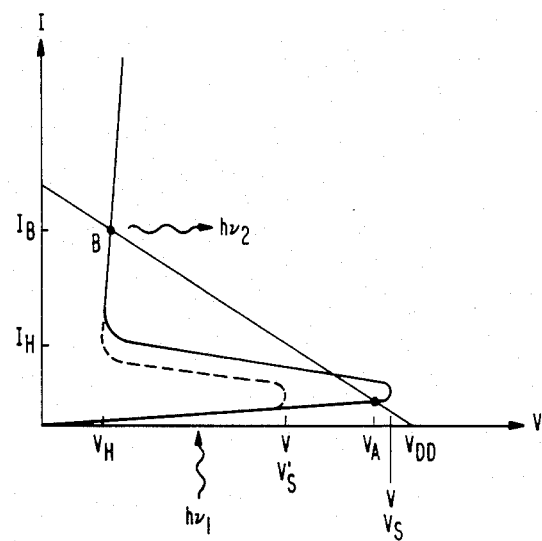
FIG. 7 is a schematic representation of an optical switch according to this invention.

The operation of the device is best explained by reference to FIG. 7 which is an exemplary current-voltage characteristic curve. In the OFF state, the load resistor and the OFF state of the characteristic intersect at point A. For maximum sensitivity, the quiescent voltage, $V_A$, is selected to be as close as possible to $V_S$. Thus, when a small light signal $h\nu_1$, with $\nu_1$ being greater than the bandgap, is incident on the device active area, the switching voltage decreases from $V_s$ to $V'_2$. The illuminated characteristic is shown by the dashed line. The only stable operating point is at B for this condition. This is the point at which the load resistor cuts the ON state of the device. In the ON state, the device emits light at a frequency $\nu_2$ which is characteristic of the bandgap of the collector, that is, the active region, and of well-defined optical power proportional to a well-defined current. Therefore, the device accomplishes the function of optical regeneration as shown in FIG. 6.

That is, an optical signal at a power $P_2$ and frequency $\nu_2$ is produced by an optical signal having a power $P_1$ and frequency $\nu_1$. $P_2$ can be equal to or greater than $P_1$.

The switch may be turned OFF by lowering the voltage below $V_H$, the holding voltage for the ON state, while reducing the current through the switch below the holding current in the ON state.

It will be apparent that with the use of the smaller series resistor, the current in the ON state and hence, the intensity of the light emitter can be varied. In other words, the optical gain is limited only by the power dissipation handling capabilities of the switch. The slope of the line between A and B is proportional to (1/R), and appropriate choice of R will thus determine the output light intensity.

Figure 8:
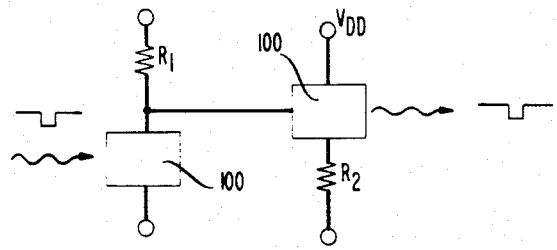
FIG. 8 is a schematic representation of an optical repeater according to this invention.

Another application is indicated schematically in FIG. 8. This application represents a digital optical receiver using two switches 100. The first switch is connected as in FIG. 6 and the second switch has a resistance between the emitter and ground. The two switches are electrically connected between the substrate of the first switch and the third terminal of the second switch. The first switch receives the incident light and is biased with resistor $R_1$. The choice of $R_1$ will be evident after the discussion of FIG. 7. When no light is incident, the device is stable in the OFF state at point A. With an optical 1 signal, that is, incident light, the IV characteristic changes as shown in FIG. 7 and the device is stable in the ON state at point B'. When the optical intensity drops, the IV curve reverts to the dark illumination situation and the device returns to point A. The optical output of the first switch is not being used. The device is biased at a very low power level in the ON state. It is a switch used as a high speed optical to electrical transducer. During operation, the collector voltage of the first switch moves between $V_{DD}$ and $V_H$. Thus, the optical signal is converted to a digital electrical form. The signal at this point is large, essentially $V_{DD}-V_H$, and has been obtained due to the large optical to electrical gain inherent in the device. A regenerated optical signal used as an input into another optical fiber may be obtained by using the electrical signal from the first switch to drive the electrical input terminal of the second switch as shown, i.e., the first and second switches are connected between the substrate and third terminal, respectively. The second switch turns ON and the light output intensity is determined almost entirely by the load resistor $R_2$. The role played by the second switch is that of combined laser and laser driver.

Still other embodiments will be readily thought of by those skilled in the art. For example, an inverter can easily be obtained by a modification of FIG. 8. The first and second switches, as well as resistances $R_1$ and $R_2$, are interchanged and light is incident from the right rather than the left.

Figure 9:
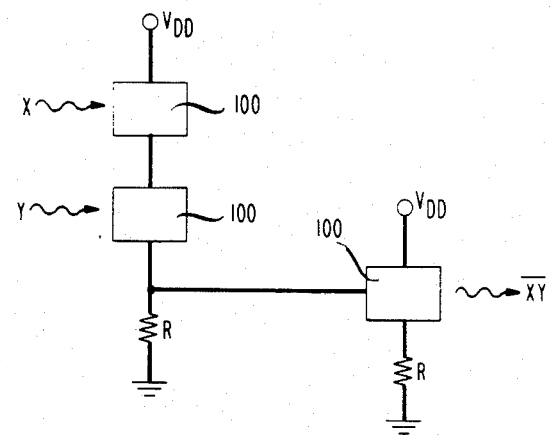
FIG. 9 is a schematic representation of an optical NAND gate.

Other optical logic circuits are contemplated. An optical NAND circuit is depicted in FIG. 9. It comprises first and second series connected switches 100. The emitter contact of the second switch is connected to resistance R and the third terminal of the third switch 100. The emitter contact of the third switch is connected to ground through resistance R. The substrates of the first and third switches are connected to $V_{DD}$. The operation of the circuit will be evident to those skilled in the art and need not be described in detail.

Figure 10:
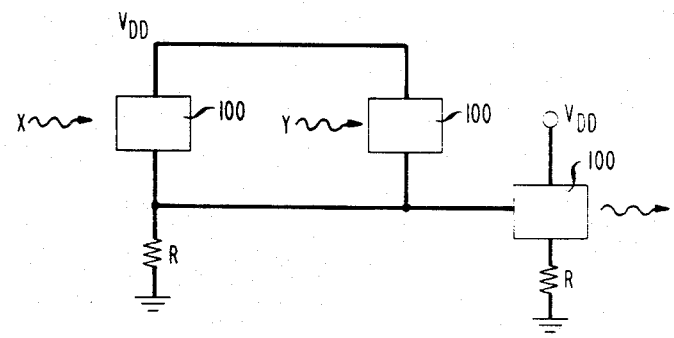
FIG. 10 is a schematic representation of an optical NOR gate.

An optical NOR gate is depicted in FIG. 10. This is similar to FIG. 9, except that the first and second switches are parallel, rather than series, connected between $V_{DD}$ and resistance R. Again, operation of the circuit will be evident to those skilled in the art and need not be described in detail.

What is claimed is:

1. A switch comprising first and second regions having a first conductivity type and first and second bandgaps; said regions having an interface adapted to the formation of an inversion layer, a third region, said third region having a second conductivity type and a third bandgap, said second bandgap being less than said first and third bandgaps, said second and third regions having an interface; said first, second and third regions comprising semiconductors selected from the group consisting of Group II–VI and Group III–V semiconductors, electrical contacts to said first and at least one of said second and third regions; and means for optically illuminating said second region.

2. A switch as recited in claim 1 further comprising a first resistance connected to at least one of said first and third regions.

3. A switch as recited in claim 2 in which said first resistance is connected to said first region.

4. An optical device comprising a first switch as recited in claim 3, and further comprising a second switch, said second switch comprising first and second regions having a first conductivity type and first and second bandages; said regions having an interface adapted to the formation of an inversion layer; a third region, said third region having a second conductivity type and a third bandgap, said second bandgap being less than said first and third bandgaps, said second and third regions having an interface; said first, second and third regions comprising semiconductors selected from the group consisting of Group II–VI and Group III–V semiconductors, electrical contacts to said first and at least one of said second and third regions; and means for optically illuminating and second region, said second switch having a third terminal, said first and second switches being electrically connected between said first region and said third terminal of said second switch.

5. An optical device as recited in claim 4, further comprising a second resistance connected to said third region of said second switch.

6. A switch as recited in claim 2 in which said first resistance is connected to said third region.

7. An optical device comprising a first switch as recited in claim 2 and further comprising a second switch said second switch comprising first and second regions having a first conductivity type and first and second bandgaps; said regions having an interface adapted to the formation of an inversion layer, a third region, said third region having a second conductivity type and a third bandgap; said second and third regions having an interface, said first, second and third regions comprising semiconductors selected from the group consisting of Group II–VI and Group III–V semiconductors, electrical contacts to said first and at least one of said second and third regions; and means for optically illuminating said second region, said second switch having a third terminal, said first and second switches being electrically connected between said third region and said third terminal of said second switch, a first resistance connected to said region of said first switch.

8. An optical device as recited in claim 7, a second resistance connected to said third region of said second switch.

9. An optical device as recited in claim 8 further comprising a third switch, said third switch comprising first and second regions having a first conductivity type and first and second bandgaps; said regions having an interface adapted to the formation of an inversion layer; a third region, said third region having a second conductivity type and a third bandgap, said second bandgap being less than said first and third bandgaps, said second and third regions having an interface; said first, second and third regions comprising semiconductors selected from the group consisting of Group II–VI and Group III–V semiconductors, electrical contacts to said first and at least one of said second and third regions; and means for optically illuminating said second region, said first and third switches being series connected.

10. An optical device as recited in claim 3 further comprising a third switch, said third switch comprising first and second regions having a first conductivity type and first and second bandgaps; said regions having an interface adapted to the formation of an inversion layer; a t hird region, said third region having a second conductivity type and a third bandgap, said second bandgap being less than said first and third bandgaps, said second and third regions having an interface; said first, second and third regions comprising semiconductors selected from the group consisting of Group II–VI and Group III–V semiconductors, electrical contacts to said first and at least one of said second and third regions; and means for optically illuminating said second region, said first and third switches being parallel connected.

* * * * *